United States Patent
Maeda et al.

(10) Patent No.: US 7,531,909 B2
(45) Date of Patent: May 12, 2009

(54) METHOD AND APPARATUS FOR CONTROLLING CHARGING OPERATIONS FOR BATTERY

(75) Inventors: Syunichi Maeda, Anjo (JP); Tadatoshi Asada, Anjo (JP)

(73) Assignee: Denso Corporation, Kariya (JP)

( * ) Notice: Subject to any disclaimer, the term of this patent is extended or adjusted under 35 U.S.C. 154(b) by 13 days.

(21) Appl. No.: 11/976,390

(22) Filed: Oct. 24, 2007

(65) Prior Publication Data
US 2008/0093851 A1    Apr. 24, 2008

(30) Foreign Application Priority Data
Oct. 24, 2006    (JP)    ............... 2006-288225

(51) Int. Cl.
*H02P 9/00*    (2006.01)
(52) U.S. Cl. .................................. 290/40 C
(58) Field of Classification Search ............... 290/40 C
See application file for complete search history.

(56) References Cited

U.S. PATENT DOCUMENTS

| | | | | |
|---|---|---|---|---|
| 6,318,487 B2* | 11/2001 | Yanase et al. | ............ | 180/65.2 |
| 6,612,386 B2* | 9/2003 | Tamai et al. | ............ | 180/65.4 |
| 7,301,304 B2* | 11/2007 | Weisgerber et al. | ......... | 320/132 |
| 2005/0189918 A1* | 9/2005 | Weisgerber et al. | ......... | 320/132 |
| 2005/0263333 A1* | 12/2005 | Fujiki | ................. | 180/65.2 |
| 2006/0100057 A1* | 5/2006 | Severinsky et al. | ............. | 477/4 |
| 2006/0220453 A1* | 10/2006 | Saito et al. | .................. | 303/152 |
| 2007/0262749 A1* | 11/2007 | Luan et al. | .................. | 320/132 |
| 2008/0032858 A1* | 2/2008 | Frank et al. | ................... | 477/37 |
| 2008/0191664 A1* | 8/2008 | Abe | ........................... | 320/137 |
| 2008/0243322 A1* | 10/2008 | Nobumoto et al. | ........... | 701/22 |

FOREIGN PATENT DOCUMENTS

| JP | A 2003-209935 | 7/2003 |
|---|---|---|
| JP | A 2005-57853 | 3/2005 |

\* cited by examiner

*Primary Examiner*—Joseph Waks
(74) *Attorney, Agent, or Firm*—Oliff & Berridge, PLC (57) ABSTRACT

An apparatus controls a state of charge (SOC) of a battery mounted on a vehicle provided with an internal combustion engine driving a generator mounted on the vehicle. The generator charges the battery. In the apparatus, a setting unit sets a target value directed to controlling the SOC of the battery such that the target value is higher as an efficiency of the internal combustion engine depending on the number of rotations of the engine is higher. A determining unit determines whether the vehicle is in a decelerated state. A controlling unit controls a state of rotation of the generator to enable the generator i) to perform regeneration when it is determined that the vehicle is in the decelerated state and ii) to perform generation to enable the SOC of the battery to be the target value when it is determined that the vehicle is not in the decelerated state.

14 Claims, 5 Drawing Sheets

EQUI-FUEL CONSUMPTION CURVE

TORQUE[Nm]

A(88%) | B(92%) | C(90%)

ENGINE SPEED

FIG.5

EQUAL EFFICIENCY CURVE
PRESENT VALUE B
TARGET VALUE
PRESENT VALUE A

OUTPUT CURRENT

GENERATOR SPEED

METHOD AND APPARATUS FOR CONTROLLING CHARGING OPERATIONS FOR BATTERY

CROSS-REFERENCE TO RELATED APPLICATION

This application is based on and claims the benefit of priority from earlier Japanese Patent Application No. 2006-288225 filed Oct. 24, 2006, the description of which is incorporated herein by reference.

BACKGROUND OF THE INVENTION

1. Technical Field of the Invention

The present invention relates to a method and an apparatus for controlling charging operations for battery, which operations are conducted by a vehicle generator loaded, for example, on a passenger car or a truck.

2. Related Art

As known well, a battery mounted in vehicles need to be adjusted on its operating conditions. Such an example is disclosed in Japanese Patent Laid-Open Publication No. 2003-209935, in which there is disclosed a method for controlling adjustment voltage so that an integrated value of charge/discharge current of an on-vehicle battery will be zeroed, with the aid of the battery-condition (voltage, current and temperature) detecting means, the adjustment voltage controlling means (microcomputer) and the regulator. In this conventional method, adjustment voltage of a vehicle generator is controlled so that an integrated value of charge/discharge current will be zeroed. Liquid loss caused by deterioration in fuel consumption and overcharge has been prevented by performing this control.

Further, as disclosed, for example, in Japanese Patent Laid-Open Publication No. 2005-057853, a method has been known for estimating storage conditions of a battery in a deceleration state and for determining execution of power generation suppression in an acceleration state based on the estimation, with the aid of the driving condition (acceleration, deceleration and low speed) estimating means, the battery condition estimating means and the power generation suppressing means. This conventional method can effect power generation control in response to traveling conditions, based on battery conditions.

The conventional methods mentioned above have been developed without considering engine efficiency or power generation efficiency of a vehicle generator. Therefore, there has been a problem that an operation in a state where these efficiencies are low, has increased useless fuel consumption. In the method disclosed in Japanese Patent Laid-Open No. 2005-057853, the controller for estimating storage conditions of a battery or for determining the execution of power generation suppression is located distanced from the battery. This has raised a problem that the battery is likely to be affected by noise. When this controller has been realized by using an engine control microcomputer, there has been a problem that high engine speed may impose a heavy processing load on the microcomputer in the engine control and that appropriate power generation control may not possibly be performed.

SUMMARY OF THE INVENTION

The present invention has been made in light of the problems mentioned above and has an object of providing a charge control system which is able to suppress useless fuel consumption.

Another object of the present invention is to provide a charge control system, which is unlikely to be affected by noise and is able to constantly perform appropriate control of power generation Irrespective of the engine speed, in addition to providing the foregoing charge control system which is able to suppress useless fuel consumption.

In order to resolve the problems mentioned above, the charge control system of the present invention divides the engine speed into a plurality of regions based on the engine efficiency. In a high-efficiency engine speed region, the configurations of the present invention are provided. That is, there is provided an apparatus for controlling a state of charge (SOC) of a battery mounted on a vehicle provided with an internal combustion engine driving a generator mounted on the vehicle, the battery being charged by power from the generator. The apparatus comprises a setting unit that sets a target value directed to control of the state of charge of the battery such that the target value is higher as an efficiency of the internal combustion engine depending on the number of rotations of the engine is higher; a determining unit that determines whether or not the vehicle is in a decelerated state; and a controlling unit that controls a state of rotation of the generator so as to enable the generator I) to perform regeneration when it is determined by the determining unit that the vehicle is in the decelerated state and II) to perform generation to enable the state of charge of the battery to be the target value when it is determined by the determining unit that the vehicle is not in the decelerated state.

Since the power generation control of the vehicle generator is performed by setting a target SOC in consideration of the engine efficiency, the power generation amount can be increased when the engine efficiency is good and can be decreased when the engine efficiency is bad to thereby suppress useless fuel consumption. Further, the regenerative generation in a state where the vehicle is decelerated may reduce the power generation amount that will be required for reaching the target SOC in other states. Thus, useless fuel consumption can further be suppressed.

Preferably, the apparatus further comprises a further determining unit that determines whether or not the state of charge of the battery is within a preset state-of-charge range indicative of the state of charge of the battery higher than a reference value; and a further controlling unit that controls the state of rotation of the generator such that an efficiency of the generation of the generator becomes higher, when it is determined by the determining unit that the vehicle is not in the decelerated state and it is determined by the further determining unit the state of charge of the battery is within the preset state-of-charge range.

By performing the power generation control for the vehicle generator when the battery charge/discharge condition SOC has reached the high-charge state (when there is room in the battery capacity), useless fuel consumption can further be suppressed.

Preferably, the setting unit includes a current sensor secured to either a terminal or a casing of the battery, the current sensor being for detecting a charge/discharge current of the battery to set the target value, and the setting unit, the determining unit, the further determining unit, controlling unit, and further controlling unit are integrated with the current sensor.

Thus, processing load of an external control unit for engine control can be mitigated. Also, performing power generation control based on the target SOC independently of the engine control, appropriate power generation control can be performed even when the processing load for the engine control is large (even when the engine is in high-speed rotation).

DETAILED DESCRIPTION OF THE PREFERRED EMBODIMENTS

With reference to the accompanying drawings, hereinafter will now be described a charge control system according to embodiments of the present invention.

Figure 1:
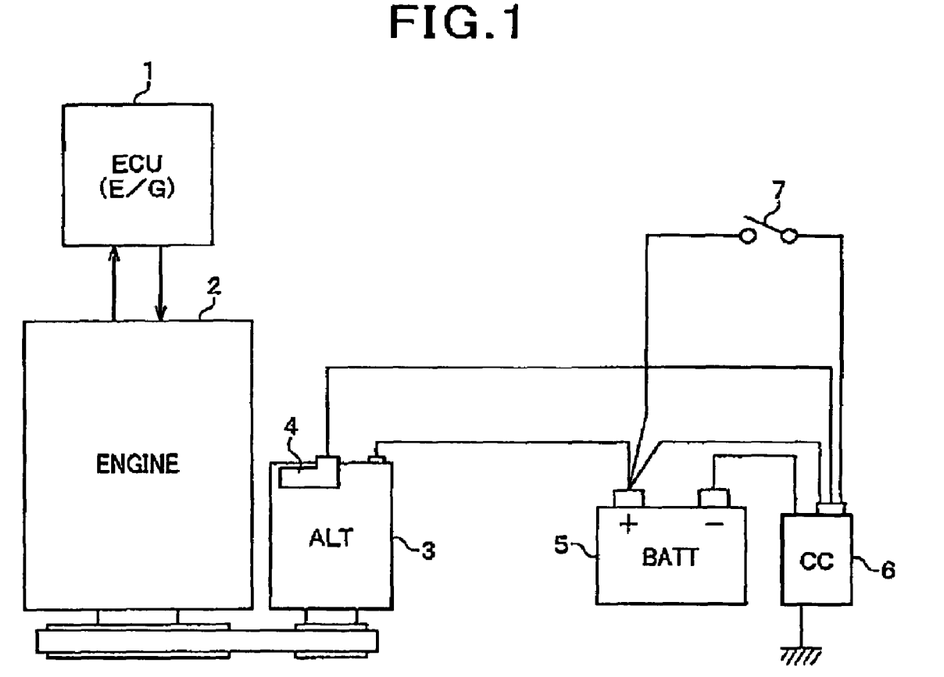
FIG. 1 is a schematic diagram illustrating a general configuration of a charge system including a charge control system according to an embodiment of the present invention.

FIG. 1 is a schematic diagram illustrating a general configuration of a charge system in which a charge control system according to an embodiment of the present invention is incorporated. The charge system shown in FIG. 1 includes an ECU (electronic control unit) 1 for an engine (E/G), an internal combustion engine 2, an on-vehicle generator (i.e., alternator: ALT) 3 (hereinafter referred to as a "generator 3"), a battery (BATT) 5, a charge control unit (CC) 6 and a key switch 7.

The ECU (E/G) 1 is an electronic control unit serving as an external control unit for controlling the engine 2, while monitoring the rotating conditions and other drive conditions of the engine 2. The generator 3 generates power by being rotated and driven by the engine 2 through a belt to supply charging power for the battery 5 and operating power for various electrical loads (not shown) in the vehicle 3. The generator 3 is incorporated with a power generation control unit 4 for vehicle (hereinafter referred to as a "generation control unit 4") for controlling output voltage by adjusting excitation current. The generation control unit 4 outputs a signal for the charge control unit 6, based on the speed of the generator 3. The charge control unit 6 monitors the voltage, current and temperature of the battery 5 and performs power generation control for the generator 3 according to battery conditions and a vehicle state. For example, the charge control unit 6 is attached to the terminals of the battery 5 or to a casing of the battery 5.

Figure 2:
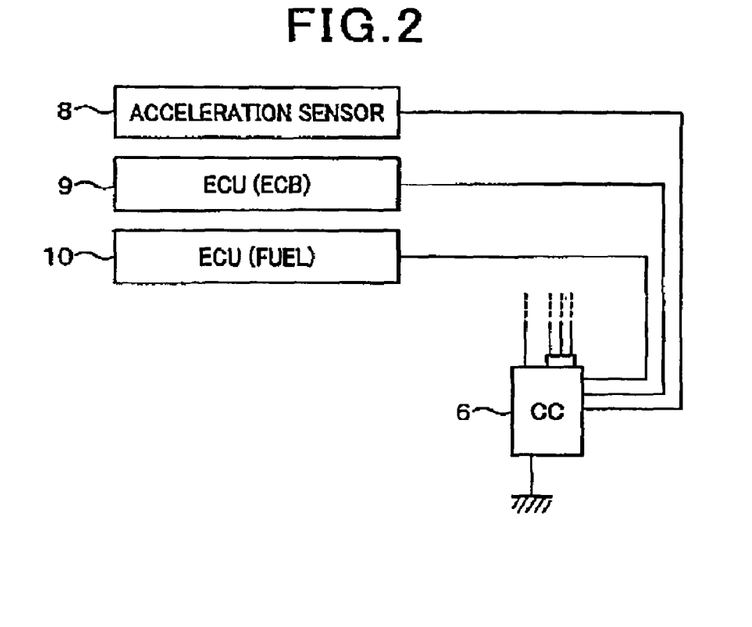
FIG. 2 is a schematic diagram illustrating an input configuration used for estimating a vehicle state in a charge system according to another embodiment of the present invention.

FIG. 2 is a schematic diagram illustrating an input configuration used for estimating a vehicle state in a charge system according to another embodiment of the present invention.

The input in the charge control unit (CC) 6 shown in FIG. 2 includes an acceleration sensor 8, an ECU (ECB) 9 and an ECU (fuel) 10. In FIG. 2, the configuration common to FIG. 1 except for the charge control unit 6, is omitted from illustration. The acceleration sensor 8 detects acceleration of a vehicle loaded with the charge system of the present embodiment, and outputs the results of the detection to the charge control unit 6. The ECU (ECB) 9 is an electronic control unit for an electronically controlled brake system (ECB), and outputs a deceleration signal to the charge control unit 6, which signal is used when brakes are put on. The ECU (fuel) 10 is an electronic control unit for performing fuel control for the engine 2, and outputs a fuel injection amount signal for the engine 2 to the charge control unit 6. It should be appreciated that the fuel control performed by the ECU (fuel) 10 may be performed by the ECU (E/G) 1. In estimating operating conditions, at least one signal inputted from the acceleration sensor 8, the ECU (ECB) 9 and the ECU (fuel) 10 may be used. Signals that are not used for estimation may be omitted from input.

Figure 3:
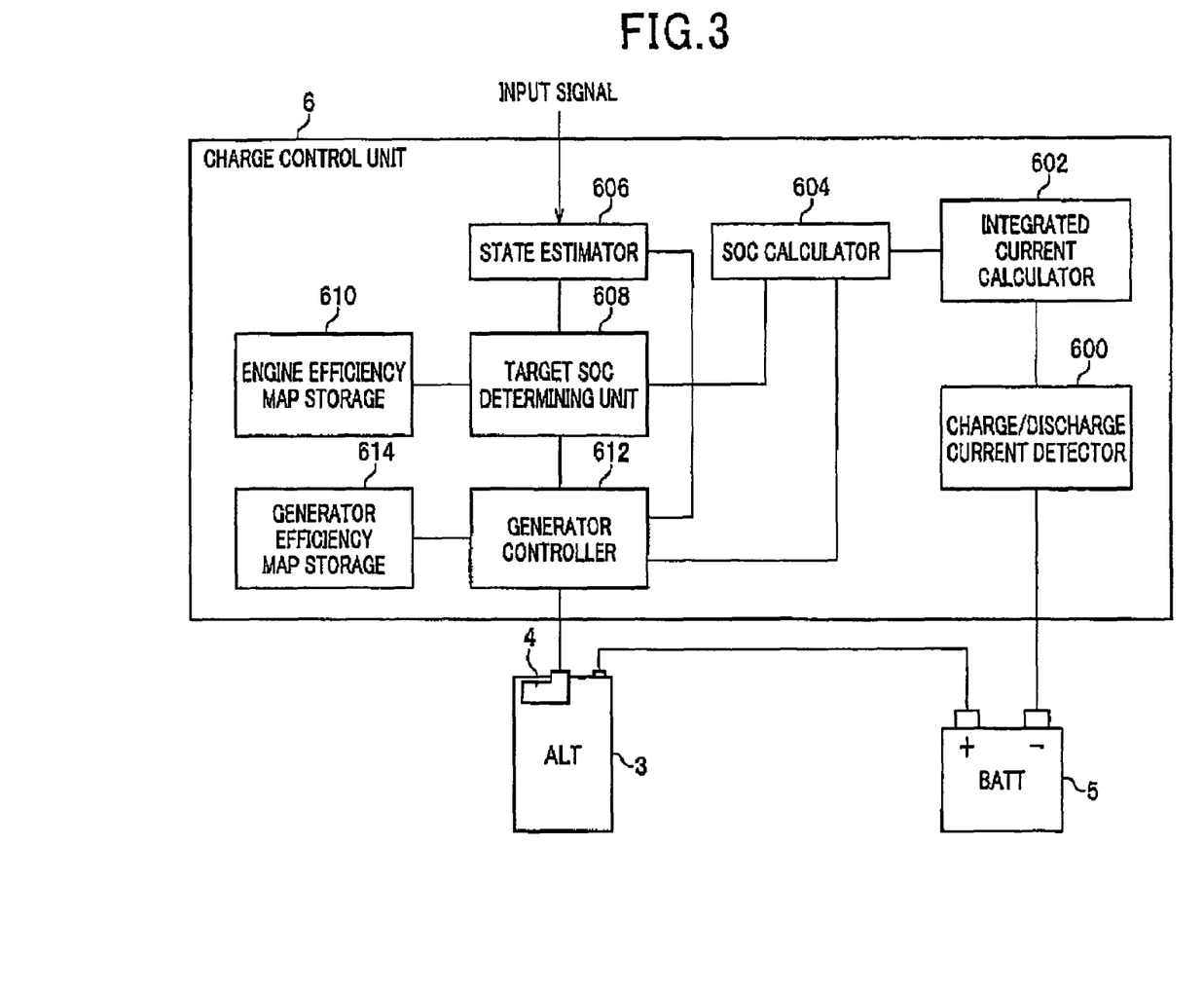
FIG. 3 is a block diagram illustrating a detailed configuration of a charge control unit.

FIG. 3 is a block diagram illustrating a detailed configuration of the charge control unit 6. As shown in FIG. 3, the charge control unit 6 of the present invention includes a charge/discharge current detector 600, an integrated current calculator 602, an SOC (state of charge) calculator 604, a state estimator 606, a target SOC determining unit 608, an engine efficiency map storage 610, and a generator controller 612, a generator efficiency map storage 614.

The target SOC determining unit 608 is included in target setting means or a target setting unit, the state estimator 606 is included in determining means or a determining unit, and the generator controller 612 included in controlling means or a controlling unit.

The charge/discharge current detector 600 detects charge/discharge current of the battery 5. The integrated current calculator 602 integrates the charge/discharge current of the battery 5, which is detected by the charge/discharge current detector 600 to calculate an integrated current. The SOC calculator 604 calculates an SOC of the battery 5 using the integrated current calculated by the integrated current calculator 602.

The SOC indicates a charged rate [%] of a battery, which means the rate of a residual capacity of the battery to a full charge capacity thereof. As the method for calculating the SOC, various approaches that have conventionally been taken can be used. For example, an SOC at the time when the key switch 7 is turned off may be stored. Then, when the key switch 7 is subsequently turned on, the SOC may be renewed by accumulating the integrated current value on the recorded SOC.

The state estimator 606 estimates a vehicle state based on the signals inputted, for example, from the generation control unit 4, the acceleration sensor 8, the ECU (ECB) 9 and the ECU (fuel) 10. The vehicle states to be estimated include a "deceleration state" corresponding to the period of deceleration, a "malfunction state" corresponding to the period when signals inputted from the acceleration sensor 8 or the like are stopped or the period when the contents of the signals are out of an appropriate range, and an "efficient generation state" other than the above. The state estimation performed by the state estimator 606 may only have to use at least one signal among the signals inputted from the generation control unit 4, the acceleration sensor 8, the ECU (ECB) 9 and the ECU (fuel) 10. The signals that are not used for the estimation may be omitted from the input to the state estimator 606.

Figure 4:
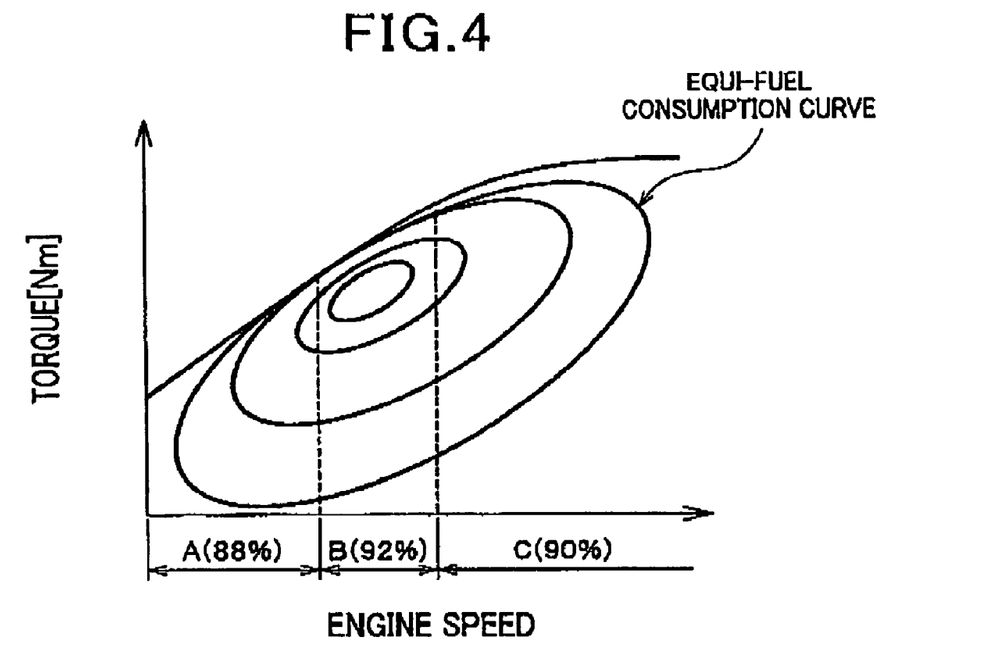
FIG. 4 illustrates a specific example of an engine efficiency map and a general outline for determining a target SOC (state of charge)

When the vehicle state estimated by the state estimator 606 is the "efficient generation state", the target SOC determining unit 608 determines a target SOC. The determination on the target SOC is performed by using the engine efficiency map stored in the engine efficiency map storage 610. FIG. 4 illustrates a specific example of an engine efficiency map and a general outline for determining a target SOC. In FIG. 4, the horizontal axis represents engine speed and the vertical axis represents torque generated by the engine 2. An equi-fuel consumption curve having substantially an elliptical shape is collateral to high engine efficiency as the diameter becomes smaller. The engine efficiency map is sequentially divided into regions A, B and C starting from low engine speed, with the target SOC corresponding to the individual regions being set at 88%, 92% and 90%, respectively. The target SOC determining unit 608 estimates an engine speed based on the speed of the generator 3, which is inputted from the generation control unit 4, and determines a target SOC corresponding to the engine speed by using the engine efficiency map shown in FIG. 4.

The generator controller 612 determines adjustment voltage or excitation current based on the results of estimation by the state estimator 606 and the target SOC determined by the target SOC determining unit 608, so that power generation amount of the generator 3 can be controlled. The generator efficiency map storage 614 stores a generator efficiency map required for the power generation control by the generator controller 612.

Figure 5:
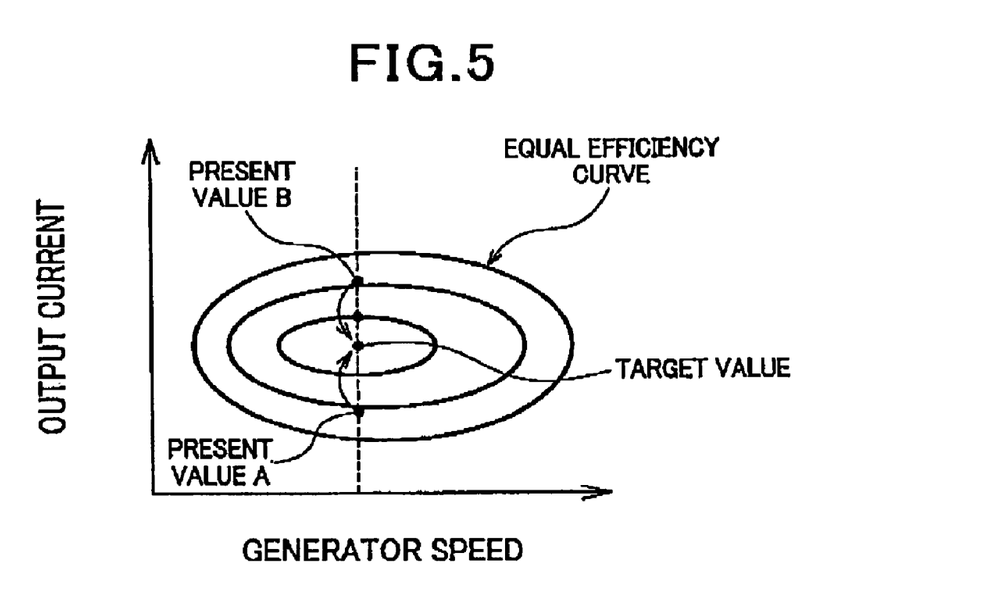
FIG. 5 illustrates a specific example of a generator efficiency map.

FIG. 5 illustrates a specific example of a generator efficiency map. In FIG. 5, the vertical axis represents the speed of the generator 3, and the vertical axis represents the output current of the generator 3. Substantially elliptical equal efficiency curve is collateral to high generation efficiency as the diameter becomes smaller. Other than the generator efficiency map, FIG. 5 shows a general outline for raising current generation efficiency without changing the speed of the generator. For example, assuming that the generator 3 is in operation with its speed and its output current corresponding to a present value A, the most efficient generation efficiency can be achieved by increasing the output current up to a target value, while retaining the generator speed at the same level. Also, assuming that the generator 3 is in operation with its speed and its output current corresponding to a present value B, the most efficient generation efficiency can be achieved by decreasing the output current down to a target value, while retaining the generator speed at the same level. Details of the power generation control by the generator controller 612 using the generator efficiency map will be described later.

The charge control unit 6 of the present embodiment is obtained by incorporating the configurations of the integrated current calculator 602, the SOC calculator 604, the state estimator 606, the target SOC determining unit 608, the engine efficiency map storage 610, the generator controller 612 and the generator efficiency map storage 614, into a conventional current sensor having a function of the charge/discharge current detector 600.

Figure 6:
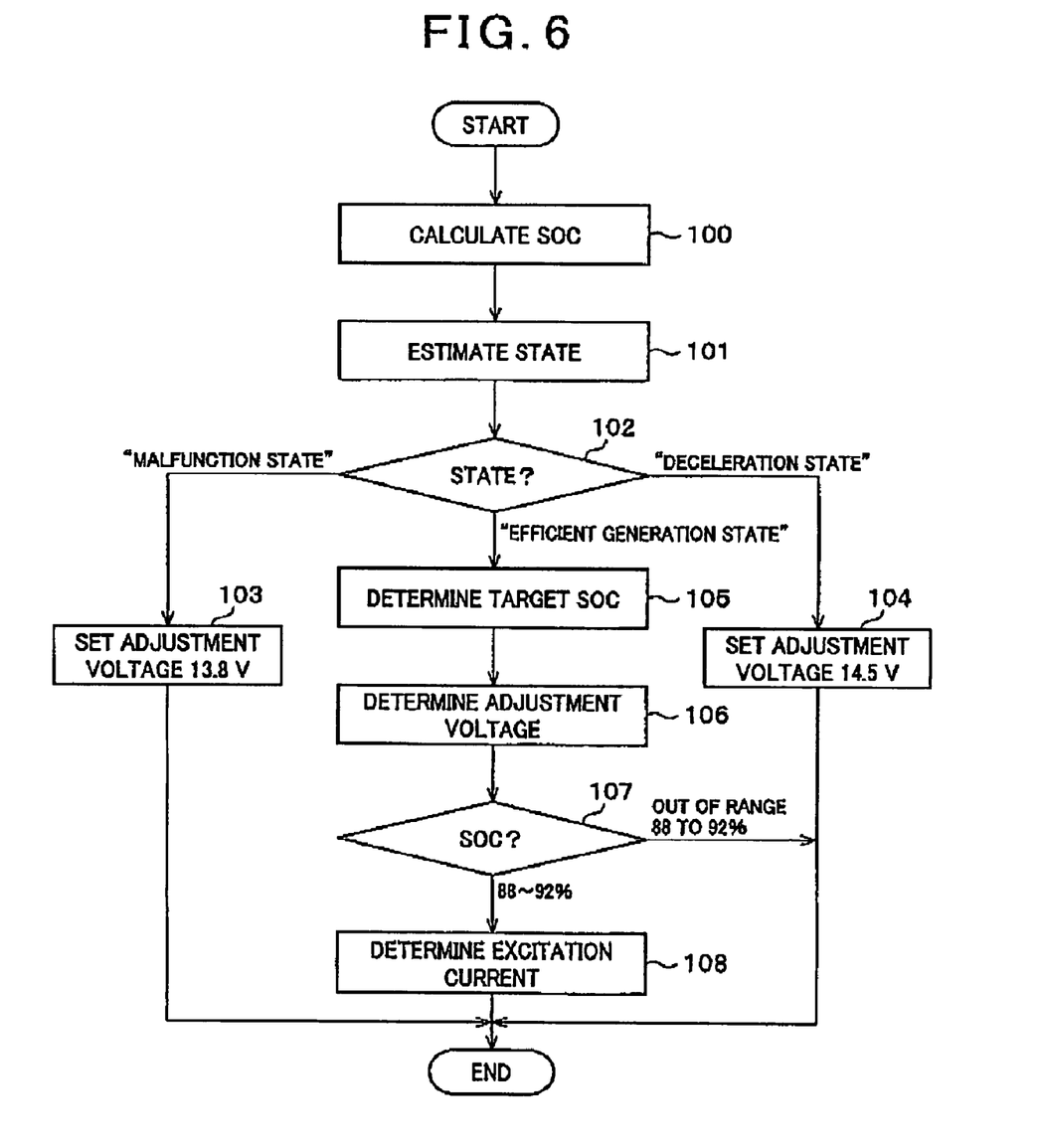
FIG. 6 is a flow diagram illustrating an operation procedure performed by a charge control unit.

The charge control unit 6 of the present embodiment has the configuration as described above. Hereinafter will be described its operation. FIG. 6 is a flow diagram illustrating an operation procedure performed by the charge control unit 6. When charge/discharge current detection of the battery 5 is performed by the charge/discharge current detector 600, the integrated current calculator 602 calculates an integrated current value of the detected charge/discharge current, and the SOC calculator 604 calculates an SOC of the battery 5 (step 100).

Subsequently, a state estimator 606 estimates a vehicle state based on signals inputted from the generation control unit 4 and the like (step 101) to estimate any of the "deceleration state", the "malfunction state" and the "efficient generation state" (step 102). When the vehicle has been estimated as being in the "malfunction state", the generator controller 612 sets an adjustment voltage 13.8 V at the generator 3 (step 103). This value of 13.8 V is set on the assumption that the control of the power generation amount of the generator 3 is performed under the autonomous control of the generation control unit 4. The generation control unit 4 performs power generation control so that the adjustment voltage will be 13.8 V, i.e. so that the output voltage of the generator 3 (or positive-side terminal voltage of the battery 5) will be 13.8 V. However, this value (13.8 V) is only an example and thus other values may be usable.

When the vehicle is estimated as being in the "deceleration state" at step 102, the generator controller 612 sets the adjustment voltage of the generator 3 at 14.5 V in order to perform regenerative generation (step 104). The value 14.5 V corresponds to an adjustment voltage that can set the excitation current at substantially an upper limit. Thus, the value 14.5 V allows for transfer to a forced generation state, so that the generated torque can be utilized for decelerating the vehicle and that the battery 5 can be charged by the generated power at this time. However, this value (14.5 V) is only an example and thus other values may be usable.

When the vehicle is estimated as being in the "efficient generation state" at step 102, the target SOC determining unit 608 determines a target SOC suitable for the engine speed by using the engine efficiency map (step 105).

Subsequently, the generator controller 612 determines an adjustment voltage of the generator 3 so that the present SOC will be the target SOC (step 106). The determination of the adjustment voltage can be performed by PI (proportional integral) control, in which a value ΔSOC obtained by subtracting the present SOC from the target SOC is inputted. For example a ΔVreg in proportion to the value ΔSOC is determined. This ΔVreg is an increase/decrease value to be added to a value of a present adjustment voltage Vreg. In this way, an adjustment voltage Vreg after renewal is determined for the generator 3. It should be appreciated that the method for determining the adjustment voltage Vreg is not limited to the one described above, but other methods may be useable.

Subsequently, the generator controller 612 determines whether or not the present SOC is in a range of 88 to 92% (step 107). If the present SOC is out of the range 88 to 92%, the series of operation is then ended. In this case, the generation control unit 4 performs power generation control for the generator 3, so as to be close to the target SOC determined at step 105 by using the adjustment voltage determined at step 106.

Also, if the present SOC is in the range of 88 to 92% (if the battery is in a state close to a high-charge state), the generator controller 612 determines an excitation current required for bringing the generator 3 into an operation with the highest generation efficiency (step 108). The determination of the excitation current is performed by using the generator efficiency map stored in the generator efficiency map storage 614. In particular, use of the generator efficiency map shown in FIG. 5 may teach how far the present output current should be increased/decreased if the generation efficiency is raised up to the highest under the condition where the generator speed is at a constant level. When the increase/decrease value of an output current is ΔI, an increase/decrease value ΔIf of an excitation current can be determined under the PI control with the ΔI as an input. In this way, the excitation current If after renewal can be determined for the generator 3. The method for determining the excitation current If is not limited to the one described above, but other methods may be useable. For example, a generator output map indicating a relationship between the speed, output current and excitation current of the generator may be used to designate a speed and an output current of the generator for calculation of the remaining excitation current. The series of operation shown in FIG. 6 is repeatedly executed at a predetermined interval.

Figure 7:
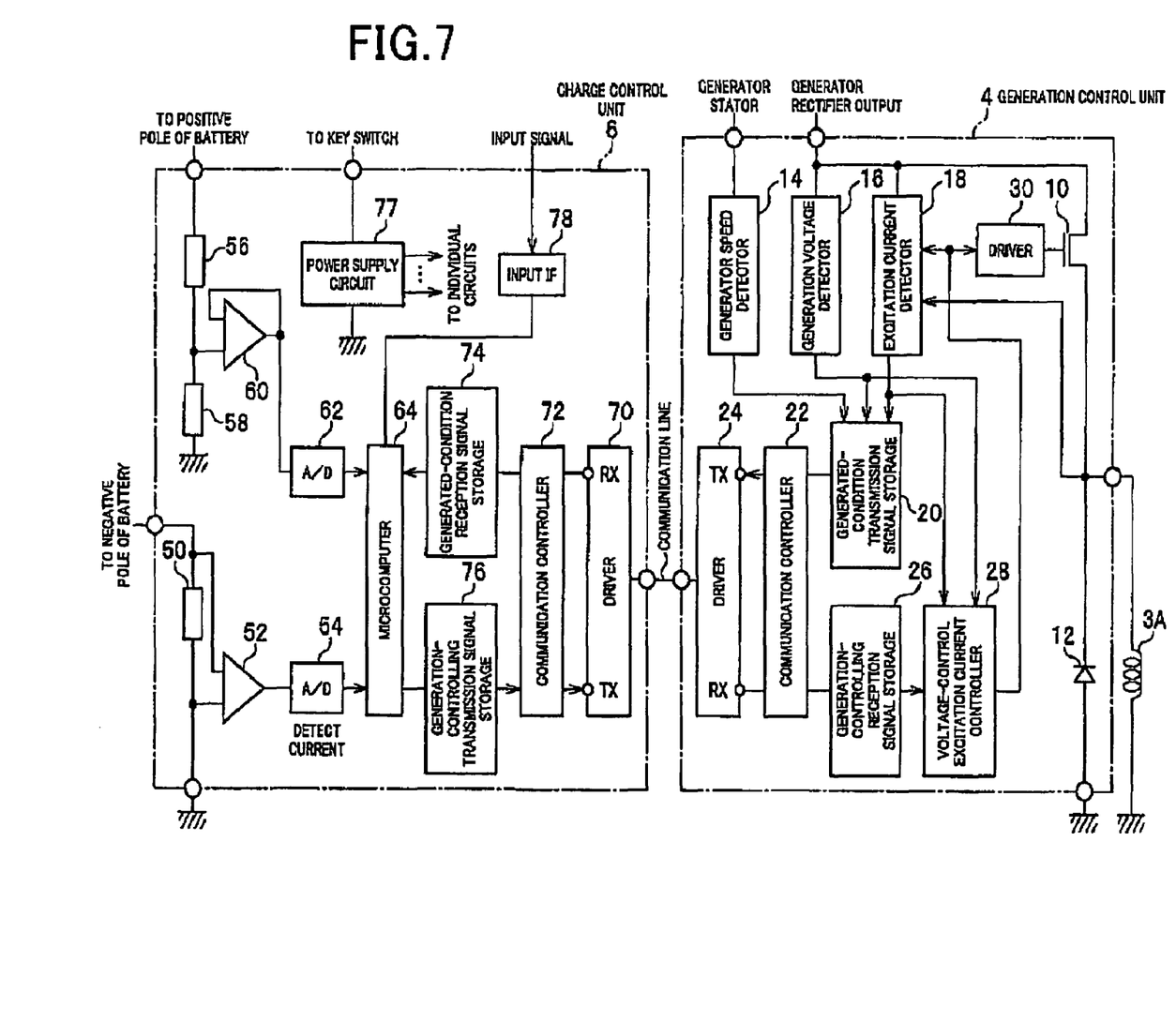
FIG. 7 is a block diagram illustrating a specific example of the configurations of a charge control unit and a power generation control unit for vehicle.

Hereinafter will be described a specific configuration for realizing the series of operation shown in FIG. 6. FIG. 7 is a block diagram illustrating a specific example of the configurations of the charge control unit 6 and the generation control unit 4. As shown in FIG. 7, the generation control unit 4 includes a power transistor 11, a reflux diode 12, a generator speed detector 14, a generation voltage detector, an excitation current detector 18, a generated-condition transmission signal storage 20, a communication controller 22, a driver 24, a generation-controlling reception signal storage 26, a voltage-control excitation current controller 28 and a driver 30.

The power transistor 11 is serially connected to an excitation winding 3A in the generator 3. When the power transistor 11 is turned on, excitation current is supplied to the excitation winding 3A. The reflux diode 12 is connected parallel to the excitation winding 3A to re-circulate the excitation current passing through the excitation winding 3A when the power transistor 11 is turned off.

The generator speed detector 14 detects the speed of the generator 3. For example, by monitoring the frequency of the phase voltage that appears across phase windings constituting the stator windings of the generator 3, the speed of the generator can be detected. The generation voltage detector 16 detects the output terminal voltage of the generator 3 as the power generation voltage. The excitation current detector 18 detects the excitation current passing through the excitation winding 3A. For example, the excitation current detector 18 monitors the on/off state of the power transistor 11 and calculates the excitation current based on the on/off state and the power generation voltage. Alternatively, the excitation current detector 18 may be connected in series with the power transistor 11 with the insertion of a shunt resistor for detecting the excitation current, so that the excitation current can be detected based on the voltage across the shunt resistor.

The generated-condition transmission signal storage 20 stores generated-condition transmission signals containing detection values of the generator speed, the power generation voltage and the excitation current, which have been detected by the generator speed detector 14, the generation voltage detector 16 and the excitation current detector 18, respectively. The communication controller 22 performs modulation processing by converting the generated-condition transmission signals into a predetermined format for digital communication. The modulated signals (digital modulation signals) are transmitted from the driver 24 to the battery condition detector 6 through a communication line.

The driver 24 mentioned above also has a function of a receiver for receiving the digital modulation signals which are adversely transmitted from the battery condition detector 6 through the communication line. The communication controller 22 mentioned above also has a function of performing demodulation processing for the digital modulation signals received by the driver 24. The generation-controlling transmission signals obtained through the demodulation processing are stored in the generation-controlling reception signal storage 26. The voltage-control excitation current controller 28 operates by effecting control so that the power generation voltage will reach a target voltage value (adjustment voltage value), or that the excitation current will reach a target current value. The controller 28 transmits driving signals, which are required for this control, to the driver 30. In response to the driving signals transmitted from the voltage-control excitation current controller 28, the driver 30 drives the power transistor 11.

As shown in FIG. 7, the charge control unit 6 includes a shunt resistor 50, amplifiers 52 and 60, analogue-digital converters (A/D) 54 and 62, resistors 56 and 58, a microcomputer 64, a driver 70, a communication controller 72, a generated-condition reception signal storage 74, a generation-controlling transmission signal storage 76, a power supply circuit, and an input interface (IF) 78. The power supply circuit 77 starts operation when the key switch 7 is turned on and supplies power required for the individual circuits. Thus, standby operation for operating the system when the key switch 7 is being turned off can be dispensed with, so that the system can be realized with a simple configuration. The power supply circuit 77 may have a configuration, in which the operation is started with a communication signal, such as CAN, to supply power required for the individual circuits. Thus, when the electrical loads are used while the engine is stopped, or when the engine is started up, the battery current can be monitored to more reliably measure the charge/discharge conditions of the battery 5.

The shunt resistor 50 is a resistor for detecting charge/discharge current of the battery 5, with its one end being connected to a negative terminal of the battery 5 and the other end being grounded. The amplifier 52 is, for example, a differential amplifier for amplifying the voltage across the shunt resistor 50. The amplified voltage is converted into digital data by the analog-digital converter 54 and inputted to the microcomputer 64. The charge/discharge current detector 600 shown in FIG. 3 is made up of the shunt resistor 50, the amplifier 52 and the analog-digital converter 54.

The resistors 56 and 58 constitute a partial-pressure circuit for detecting the terminal voltage (battery voltage) of the battery 5. One end of this partial-pressure circuit is connected to a positive terminal of the battery 5 and the other terminal is grounded. The amplifier 60 is, for example, an operational amplifier and functions as a buffer being connected to an output side of the partial-pressure circuit made up of the resistors 56 and 58. The output voltage (equals to the partial-pressure voltage that appears at a connecting point between the resistors 56 and 58 in the configuration shown in FIG. 7) of the amplifier 60 is converted into digital data by the analog-digital converter 62 and inputted to the microcomputer 64.

The driver 70 and the communication controller 72 transmits/receives of signals to/from the generation control unit 4 through the communication line. The driver 70 basically operates in the same fashion as the driver 24 and the communication controller 22 provided at the generation control unit 4. When the digital modulation signals (generated-condition transmission signals) transmitted from the generation control unit 4 through the communication line are received by the driver 70, demodulation processing is performed by the communication controller 72. Then, the obtained generated-condition reception signals are stored in the generated-condition reception signal storage 74. When the generation-controlling transmission signals outputted from the microcomputer 64 are stored in the generation-controlling transmission signal storage 76, the communication controller 72 performs modulation processing by converting the generation-controlling transmission signals into a predetermined format for digital communication. The modulated signals (digital modulation signals) are transmitted to the generation control unit 4 from the driver 70 through the communication line.

The input interface 78 receives signals inputted from the acceleration sensor 8, the ECU (ECB) 9 and the ECU (fuel) 10, and inputs them to the microcomputer 64. The microcomputer 64 actualizes the integrated current calculator 602, the SOC calculator 604, the state estimator 606, the target SOC determining unit 608, the engine efficiency map storage 610, the generator controller 612, and the generator efficiency map storage 614 shown in FIG. 3.

When the generation control unit 4 and the charge control unit 6 having the configurations as described above are used, the individual configurations in the charge/discharge unit 6 shown in FIG. 7 and the operations at the individual steps shown in FIG. 6 can be achieved as described below.

In the estimation operation performed by the state estimator 606, it is necessary to know whether or not the vehicle equipped with the state estimator 606 is in the "deceleration state". In the description provided above, the estimation as to whether or not the vehicle is in the "deceleration state" has been made based on the signals inputted from the acceleration sensor, the ECU (ECB) 9 and the ECU (fuel) 10. Alternatively, however, since the generated-condition transmission signals (generated-condition reception signals) transmitted from the generation control unit 4 to the charge control unit 6 contain the speed of the generator 3, this generator speed may be used for the estimation as to whether or not the vehicle is in the "deceleration state". In order to determine a target SOC with the target SOC determining unit 608, a present generator speed is required. In this case, the generator speed contained in the generated-condition reception signals may be used.

In the excitation current determining operation at step 108 of FIG. 6, the present excitation current If and the present output current I are required. As to the excitation current If, the one contained in the generated-condition reception signals may be used. The output current I can be calculated from the generator speed and the excitation current contained in the generated-condition reception signals as well as the generator output map mentioned above. Alternatively, an output current sensor serving as the output current detecting means may be provided in the vicinity of the output terminal of the generator 3, and a detection value derived from the output current sensor may be transmitted from the generation control unit 4 to the charge control unit 6.

In this way, in the charge control system according to the present embodiment, the target SOC is set considering the engine efficiency to perform the power generation control of the generator 3. Therefore, the power generation amount can be Increased when the engine efficiency is good and can be decreased when the engine efficiency is contrarily bad, whereby useless fuel consumption can be suppressed. Further, by performing regenerative generation when the vehicle is in decelerating state, power generation amount that will be required for reaching the target SOC in other states can be decreased to further suppress useless fuel consumption. When the vehicle is in the high-charge state (when there is room in the battery capacity), performing power generation control of the generator 3 so as to increase the generation efficiency, may further suppress useless fuel consumption.

The terminal of the battery 30 or the current sensor attached to the casing may be incorporated with the configurations other than the charge/discharge current detector 600 (the integrated current calculator 602, the SOC calculator 604, the state estimator 606, the target SOC determining unit 608, the engine efficiency map storage 610, the generator controller 612, and the generator efficiency map storage 614), so that the processing load of the ECU (E/G) 1 may be mitigated. In particular, when the power generation control is performed based on the target SOC independent of the engine control, appropriate power generation control can be performed even when the processing load for the engine control is large (even when the engine is in high-speed rotation).

Further, it is determined whether or not the vehicle is in the deceleration state based on the acceleration detected by the acceleration sensor 8. Thus, there is no need of acquiring signals from other external control unit or electronic control unit, so that connection between the individual configurations in the system can be simplified. Further, unlike the external control unit, the acceleration sensor 8 may have no variation in the processing load. Therefore, the determining unit can receive measured data Irrespective of the vehicle state.

The determining unit determines whether or not the vehicle is in the deceleration state based on a signal to be sent from an external device. Thus, the deceleration estimation is simplified to also simplify the configuration and to mitigate the processing load.

Preferably, the external device is an electronic control device for an electronically controlled brake system mounted on the vehicle and formed to a signal showing the decelerated state of the vehicle, and the determining unit determines whether or not the vehicle is in the deceleration state based on the signal from the electronically controlled brake system. Thus, the "deceleration state" of the vehicle can be reliably estimated based on the deceleration Instructions by the vehicle driver. Further, deceleration regeneration may have an effect of braking the vehicle in the same way as the brake. Accordingly, acquisition of a deceleration signal may let the driver know an operation amount of the brake. Thus, by bringing the brake into harmonization with the deceleration regeneration, the amount of regenerative generation at the time of deceleration can be increased.

Still preferably, the external device is an electronic control device for controlling fuel being supplied to the engine, the electronic control device supplying a signal indicative of an amount of fuel to be injected to the engine, and the determining unit determines whether or not the vehicle is in the deceleration state based on the signal from the electronic control device for controlling the fuel being supplied to the engine. Thus, the power generation amount can be increased at the time of deceleration in a state where fuel is not consumed, whereby fuel consumption required for generation can be reliably decreased. Also, by obtaining a fuel injection amount, power generation control can be performed according to the obtained fuel injection amount. In this way, the fuel consumption amount that may directly influence the fuel consumption effect can be decreased.

It is sufficient that, of the foregoing various types of determining units, only one type of unit is selected at the time of designing the system depending on various conditions.

Preferably, the setting unit, the determining unit, the further determining unit, the controlling unit, and the further controlling unit according to the present invention are incorporated in an external control device for controlling the engine. Thus, almost no hardware is additionally required. Accordingly, only the change of the control programs of the external control unit may realize the power generation control based on the target SOC.

The present invention is not limited to the embodiment described above, but may be variously modified and implemented within the spirit of the present invention. In the embodiment described above, the terminal of the battery 5 or the current sensor attached to the casing has incorporated the configurations other than the charge/discharge current detector 600 (the integrated current calculator 602, the SOC calculator 604, the state estimator 606, the target SOC determining unit 608, the engine efficiency map storage 610, the generator controller 612, and the generator efficiency map storage 614). However, these other configurations may be incorporated in the ECU (E/G) 1. In this way, almost no hardware is additionally required, and thus the power generation control based on the target SOC may be enabled by only changing the control programs.

What is claimed is:

1. An apparatus for controlling a state of charge (SOC) of a battery mounted on a vehicle provided with an internal combustion engine driving a generator mounted on the vehicle, the battery being charged by power from the generator, comprising:

a setting unit that sets a target value directed to control of the state of charge of the battery such that the target value is higher as an efficiency of the internal combustion engine depending on the number of rotations of the engine is higher;

a determining unit that determines whether or not the vehicle is in a decelerated state; and a controlling unit that controls a state of rotation of the generator so as to enable the generator i) to perform regeneration when it is determined by the determining unit that the vehicle is in the decelerated state and ii) to perform generation to enable the state of charge of the battery to be the target value when it is determined by the determining unit that the vehicle is not in the decelerated state.

2. The apparatus of claim 1, comprising a further determining unit that determines whether or not the state of charge of the battery is within a preset state-of-charge range indicative of the state of charge of the battery higher than a reference value; and a further controlling unit that controls the state of rotation of the generator such that an efficiency of the generation of the generator becomes higher, when it is determined by the determining unit that the vehicle is not in the decelerated state and it is determined by the further determining unit the state of charge of the battery is within the preset state-of-charge range.

3. The apparatus of claim 2, wherein the setting unit includes a current sensor secured to either a terminal or a casing of the battery, the current sensor being for detecting a charge/discharge current of the battery to set the target value, and the setting unit, the determining unit, the further determining unit, controlling unit, and further controlling unit are integrated with the current sensor.

4. The apparatus of claim 3, wherein the determining unit determines whether or not the vehicle is in the deceleration state based on the number of rotations of the generator.

5. The apparatus of claim 3, wherein the determining unit comprises an acceleration sensor that detects an acceleration of the vehicle and determines whether or not the vehicle is in the deceleration state based on the acceleration detected by the acceleration sensor.

6. The apparatus of claim 3, wherein the determining unit determines whether or not the vehicle is in the deceleration state based on a signal to be sent from an external device.

7. The apparatus of claim 6, wherein the external device is an electronic control device for an electronically controlled brake system mounted on the vehicle and formed to a signal showing the decelerated state of the vehicle, and the determining unit determines whether or not the vehicle is in the deceleration state based on the signal from the electronically controlled brake system.

8. The apparatus of claim 6, wherein the external device is an electronic control device for controlling fuel being supplied to the engine, the electronic control device supplying a signal indicative of an amount of fuel to be injected to the engine, and the determining unit determines whether or not the vehicle is in the deceleration state based on the signal from the electronic control device for controlling the fuel being supplied to the engine.

9. The apparatus of claim 2, wherein the setting unit, the determining unit, the further determining unit, the controlling unit, and the further controlling unit are incorporated in a control device for controlling the engine.

10. An apparatus for controlling a state of charge (SOC) of a battery mounted on a vehicle provided with an internal combustion engine driving a generator mounted on the vehicle, the battery being charged by power from the generator, comprising:

target value setting means for setting a target value directed to control of the state of charge of the battery such that the target value is higher as an efficiency of the internal combustion engine depending on the number of rotations of the engine is higher;

determining means for determining whether or not the vehicle is in a decelerated state; and controlling means for controlling a state of rotation of the generator so as to enable the generator i) to perform regeneration when it is determined by the determining means that the vehicle is in the decelerated state and ii) to perform generation to enable the state of charge of the battery to be the target value when it is determined by the determining means that the vehicle is not in the decelerated state.

11. The apparatus of claim 10, comprising further determining means for determining whether or not the state of charge of the battery is within a preset state-of-charge range indicative of the state of charge of the battery higher than a reference value; and further controlling means for controlling the state of rotation of the generator such that an efficiency of the generation of the generator becomes higher, when it is determined by the determining means that the vehicle is not in the decelerated state and it is determined by the further determining means the state of charge of the battery is within the preset state-of-charge range.

12. The apparatus of claim 10, wherein the target value setting means, the determining means, the further determining means, controlling means, and further controlling means are incorporated in a control device for controlling the engine.

13. A method for controlling a state of charge (SOC) of a battery mounted on a vehicle provided with an internal combustion engine driving a generator mounted on the vehicle, the battery being charged by power from the generator, comprising steps of:

setting a target value directed to control of the state of charge of the battery such that the target value is higher as an efficiency of the internal combustion engine depending on the number of rotations of the engine is higher;

determining whether or not the vehicle is in a decelerated state; and controlling a state of rotation of the generator so as to enable the generator i) to perform regeneration when it is determined that the vehicle is in the decelerated state and ii) to perform generation to enable the state of charge of the battery to be the target value when it is determined that the vehicle is not in the decelerated state.

14. The method of claim 13, comprising:

further determining whether or not the state of charge of the battery is within a preset state-of-charge range indicative of the state of charge of the battery higher than a reference value; and further controlling the state of rotation of the generator such that an efficiency of the generation of the generator becomes higher, when it is determined that the vehicle is not in the decelerated state and it is determined that the state of charge of the battery is within the preset state-of-charge range.

* * * * *